United States Patent
Chiu et al.

(10) Patent No.: US 12,238,939 B2
(45) Date of Patent: Feb. 25, 2025

(54) MEMORY DEVICE HAVING TWO MEMORY STACKS OVER ONE BOTTOM ELECTRODE

(71) Applicant: TAIWAN SEMICONDUCTOR MANUFACTURING CO., LTD., Hsinchu (TW)

(72) Inventors: Chieh-Fei Chiu, Tainan (TW); Yong-Shiuan Tsair, Tainan (TW); Wen-Ting Chu, Kaohsiung (TW); Yu-Wen Liao, New Taipei (TW); Chin-Yu Mei, Hsinchu (TW); Po-Hao Tseng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/709,845

(22) Filed: Mar. 31, 2022

(65) Prior Publication Data

US 2022/0223651 A1    Jul. 14, 2022

Related U.S. Application Data

(62) Division of application No. 16/413,716, filed on May 16, 2019, now Pat. No. 11,296,147.

(51) Int. Cl.
*H10B 63/00* (2023.01)
*H10N 70/00* (2023.01)

(52) U.S. Cl.
CPC ........... *H10B 63/30* (2023.02); *H10N 70/066* (2023.02); *H10N 70/826* (2023.02); *H10N 70/841* (2023.02)

(58) Field of Classification Search
CPC ...... H10B 63/30; H10B 63/80; H10N 70/066; H10N 70/826; H10N 70/841; H10N 70/063; H10N 70/20; H10N 70/8833
USPC ............................................................. 257/4
See application file for complete search history.

(56) References Cited

U.S. PATENT DOCUMENTS

| | | | |
|---|---|---|---|
| 10,636,842 B1 | 4/2020 | Cheng et al. | |
| 2003/0222279 A1* | 12/2003 | Jacob | G11C 11/22 257/E21.664 |
| 2010/0009466 A1* | 1/2010 | Nagai | H10B 53/30 257/E21.008 |
| 2015/0144863 A1* | 5/2015 | Jo | H10N 70/063 257/4 |
| 2015/0255718 A1* | 9/2015 | Liu | H10N 70/20 257/4 |
| 2015/0349254 A1* | 12/2015 | Chang | H10N 70/011 257/528 |

(Continued)

*Primary Examiner* — Nduka E Ojeh
*Assistant Examiner* — Laura M Dykes
(74) *Attorney, Agent, or Firm* — Birch, Stewart, Kolasch & Birch, LLP

(57) ABSTRACT

A memory device includes a first bottom electrode, a first memory stack, and a second memory stack. The first bottom electrode has a first portion and a second portion connected to the first portion. The first memory stack is over the first portion of the first bottom electrode. The first memory stack includes a first resistive switching element and a first top electrode over the first resistive switching element. The second memory stack is over the second portion of the first bottom electrode. The second memory stack comprises a second resistive switching element and a second top electrode over the second resistive switching element.

20 Claims, 14 Drawing Sheets

(56) References Cited

U.S. PATENT DOCUMENTS

| | | | | |
|---|---|---|---|---|
| 2016/0351623 A1* | 12/2016 | Chen | ................ | H10B 63/80 |
| 2016/0351806 A1* | 12/2016 | Hsieh | ................ | H10N 70/068 |
| 2017/0053967 A1* | 2/2017 | Chuang | ................ | H10N 50/01 |
| 2017/0309682 A1* | 10/2017 | Chou | ................ | H01L 23/5226 |
| 2019/0214558 A1* | 7/2019 | Ando | ................ | G11C 13/003 |
| 2019/0252606 A1 | 8/2019 | Pirovano et al. | | |
| 2020/0127197 A1 | 4/2020 | Hsieh et al. | | |

\* cited by examiner

MEMORY DEVICE HAVING TWO MEMORY STACKS OVER ONE BOTTOM ELECTRODE

PRIORITY CLAIM AND CROSS-REFERENCE

This application is a divisional application of U.S. patent application Ser. No. 16/413,716, filed May 16, 2019, now U.S. Pat. No. 11,296,147, issued on Apr. 5, 2022, the entirety of which is incorporated by reference herein in its entirety.

BACKGROUND

Many modern-day electronic devices contain electronic memory configured to store data. Electronic memory may be volatile memory or non-volatile memory. Volatile memory stores data while it is powered, while non-volatile memory is able to store data when power is removed. Resistive random-access memory (RRAM) is one promising candidate for next generation non-volatile memory technology due to its simple structure and Complementary Metal-Oxide-Semiconductor (CMOS) logic compatible process technology that is involved. An RRAM cell includes a dielectric data storage layer having a variable resistance, which is placed between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
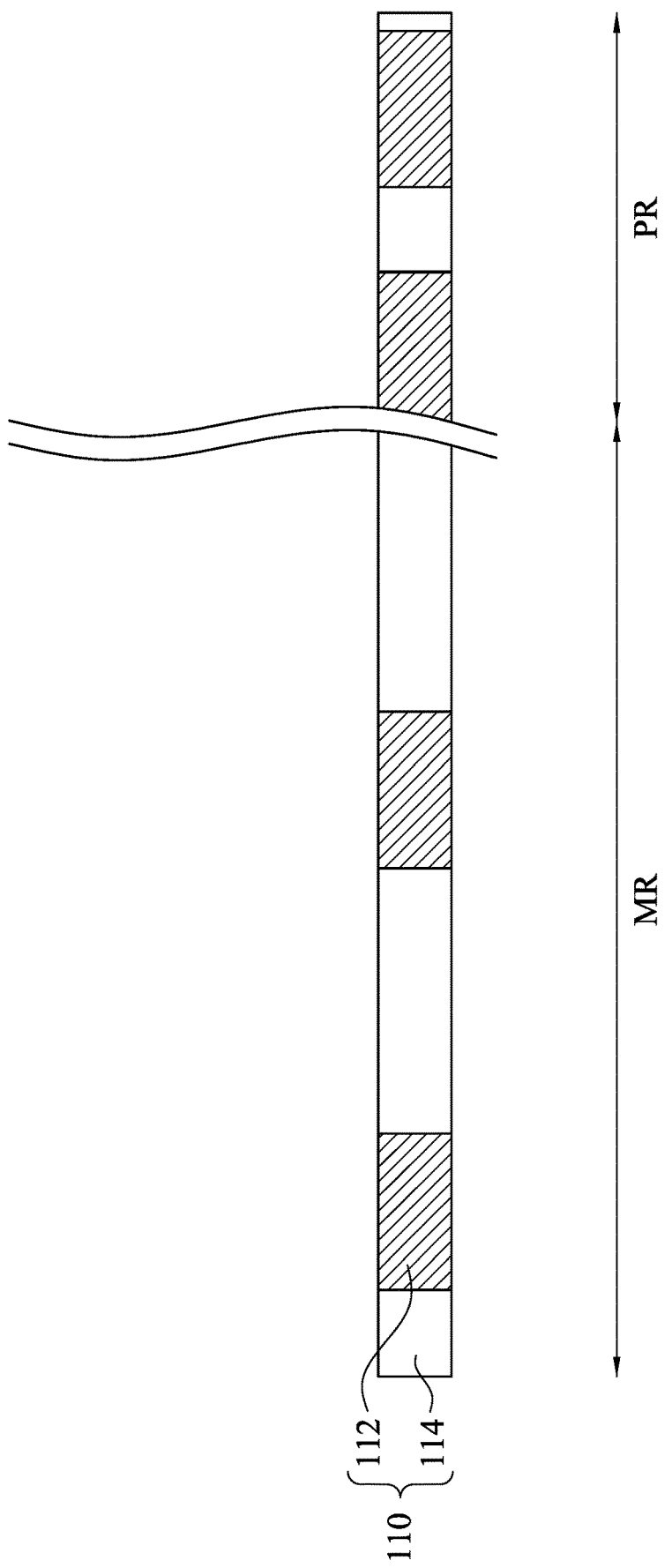
FIGS. 1 through 10C illustrate schematic views showing a method of manufacturing an integrated circuit at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random-access memory (RRAM) cells are non-volatile memory cells that store information by changes in electric resistance, not by changes in charge capacity. In general, an RRAM cell includes a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes, and each state may represent a different digital value. The RRAM cell may switch from one state to another by applying a predetermined voltage or current to the RRAM cell. For example, the RRAM cell 100 has a state of relatively high resistance, referred to as "a high resistance state", and a state of relatively low resistance, referred to as "a low resistance state". The RRAM cell may be switched from the high resistance state to the low resistance state, or from the low resistance state to high resistance state by applying a predetermined voltage or current. The RRAM cell can be used in One-Time Programmable (OTP) applications, multiple-time programmable (MTP) applications, etc.

A RRAM device and the method of forming the same are provided in accordance with various exemplary embodiments. They all have the characteristics of retaining data when power supply is cutoff once they are programmable. The intermediate stages of forming the RRAM device are illustrated. The variations of the embodiments are discussed. Throughout the various views and illustrative embodiments, like reference numbers are used to designate like elements.

FIGS. 1 through 10C illustrates a method of manufacturing an integrated circuit at various stages in accordance with some embodiments of the present disclosure. FIG. 1 illustrates a semiconductor substrate having transistors and one or more metal/dielectric layers 110 over the transistors is provided. The metal/dielectric layers 110 has a peripheral region PR where logic devices or passive devices are to be formed, and a memory region MR where memory cells are to be formed. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. The transistors are formed by suitable transistor fabrication processes and may be a planar transistor, such as polysilicon gate transistors or high-k metal gate transistors, or a multi-gate transistor, such as fin field effect transistors. After the transistors are formed, one or more metal/dielectric layers 110 of a multi-level interconnect (MLI) is formed over the transistors. The metal/dielectric layer 110 includes one or more conductive features 112 embedded in inter-layer dielectric (ILD) layer 114.

Figure 2:
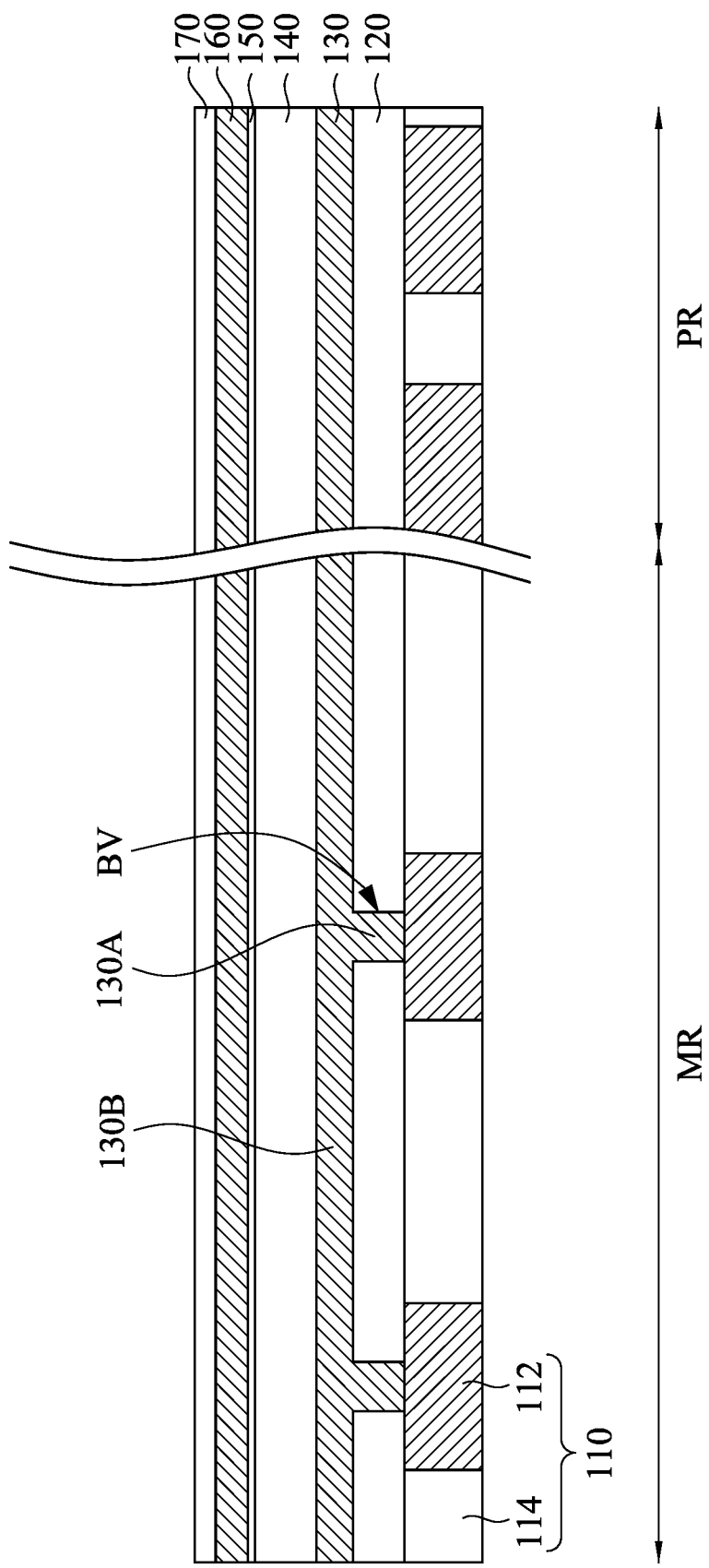

Reference is made to FIG. 2. A memory stop layer 120, a bottom electrode layer 130, a resistance switching layer 140, a cap layer 150, a top electrode layer 160, a hard mask layer 170 are formed in sequence over the peripheral region PR and the memory region CR of the metal/dielectric layers 110.

The memory stop layer 120 is deposited on the ILD 114 and the conductive features 112. The memory stop layer 120 may include silicon carbide, silicon oxynitride, silicon nitride, carbon doped silicon nitride or carbon doped silicon oxide. The memory stop layer 120 is selected to have a different etch selectivity than the bottom electrode material. Another selection criterion is the design requirements of the elements in the peripheral region PR. The memory stop layer 120 is deposited using a chemical vapor deposition (CVD) process such as plasma enhanced (PE) CVD, high-density plasma (HDP) CVD, inductively-coupled-plasma (ICP) CVD, or thermal CVD. In some embodiments, bottom electrode via BV is formed in the memory stop layer 120 over the conductive features 112 in the memory region MR by some suitable process.

In some embodiments, the bottom electrode layer 130 is deposited on the memory stop layer 120. The bottom electrode layer 130 may be formed of conductive materials, such as copper, aluminum, tantalum, tungsten, tantalum nitride (TaN), titanium, titanium nitride (TiN), the like, and/or a combination thereof. For example, the bottom electrode layer 130 may include a titanium nitride layer. The bottom electrode layer 130 can be formed using suitable deposition techniques, such as chemical vapor deposition (CVD), physical vapor deposition (PVD), atomic layer deposition (ALD), the like, and/or combinations thereof. The bottom electrode layer 130 may fill up the bottom electrode via BV. For example, the bottom electrode layer 130 includes a via portion 130A and a top portion 130B. The via portion 130A may include one or more layers and may be a conductive barrier material to a metal feature below. The top portion 130B may also include one or more layers.

In some embodiments, the resistance switching layer 140 is deposited on the bottom electrode layer 130 and directly contacts to the bottom electrode layer 130. The resistance switching layer may include a RRAM dielectric layer (e.g., metal oxides, such as one or more oxides of W, Ta, Ti, Ni, Co, Hf, Ru, Zr, Zn, Fe, Sn, Al, Cu, Ag, Mo, Cr) as in its relative high resistance state and a metal (e.g., titanium (Ti), hafnium (Hf), platinum (Pt), ruthenium (Ru), and/or aluminum (Al)) as in its relative low resistance state. In some cases, silicon may be included to form a composite material. The resistance switching layer 140 may be formed by a suitable technique, such as atomic layer deposition (ALD) with a precursor containing a metal and oxygen. Other chemical vapor deposition (CVD) techniques may be used. In another example, the resistance switching layer 140 may be formed by a physical vapor deposition (PVD), such as a sputtering process with a metallic target and with a gas supply of oxygen and optionally nitrogen to the PVD chamber. In yet another example, the resistive material layer 320 may be formed an electron-beam deposition process.

Depending on the method of deposition, the oxygen to metal ratio and other process conditions may be tuned to achieve specific resistance switching layer 140 properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

In some embodiments, the capping layer 150 is optionally formed over the resistive material layer 320. The capping layer 150 may be is a metal, for example, titanium, hafnium, platinum, ruthenium or tantalum. In some embodiments, the capping layer 150 may include hafnium oxide, aluminum oxide, tantalum oxides, other metal oxidation composite films, or the combination thereof. The capping layer 150 may be deposited using PVD, CVD, or ALD process.

In some embodiments, the top electrode layer 160 is deposited on the resistance switching layer 140. The top electrode layer 160 may be formed of conductive materials, such as copper, aluminum, tantalum, tungsten, tantalum nitride (TaN), titanium, titanium nitride (TiN), the like, and/or a combination thereof. The top electrode layer 160 may be a single-layered structure or a multilayered structure. The top electrode layer 160 can be formed using suitable deposition techniques, such as CVD, PVD, ALD, the like, and/or combinations thereof.

The hard mask layer 170 is deposited on the top electrode layer 160. In some embodiments, the hard mask layer 170 may include an oxygen containing hard mask layer, such as silicon-oxide ($SiO_2$) or silicon-oxynitride (SiON). In other embodiments, the hard mask layer 170 may comprise a hard mask layer that is substantially devoid of oxygen, such as silicon-nitride (SiN) silicon-carbide (SiC), or a composite dielectric. The hard mask layer 180 has a good etch selectivity against the bottom electrode metal. Other hard mask material including carbon-doped silicon nitride may be used.

Figure 3:
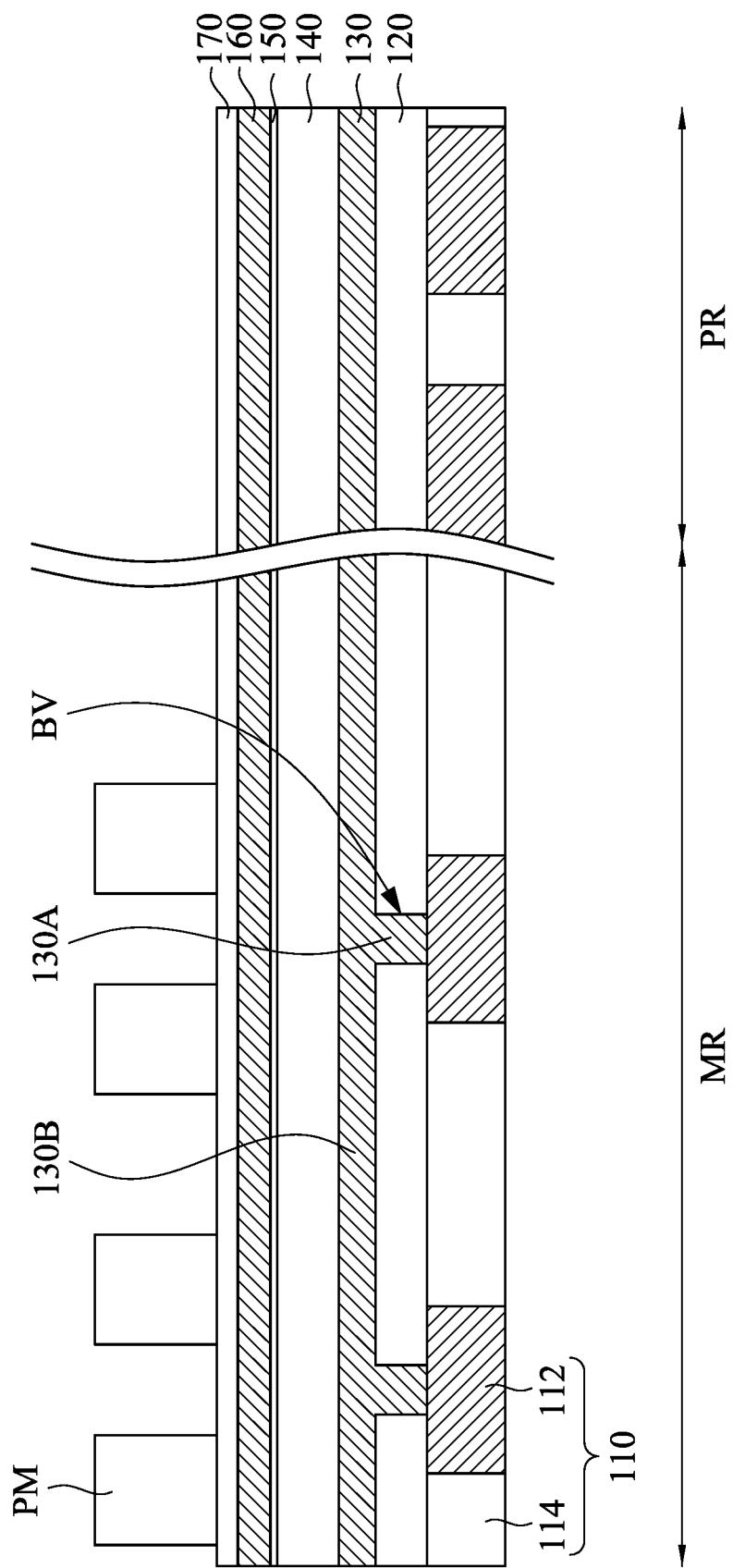

Reference is made to FIG. 3. A resist layer is formed over the hard mask layer 220, and then patterned into a patterned resist mask PM using a suitable photolithography process over the memory region MR of the metal/dielectric layers 110, such that portions of the hard mask layer 170 are exposed by the patterned resist mask PM. The patterned resist mask PM defines the positions of memory stacks. In some embodiments, the patterned resist mask PM is a photoresist. In some embodiments, the patterned resist mask PM is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 4:
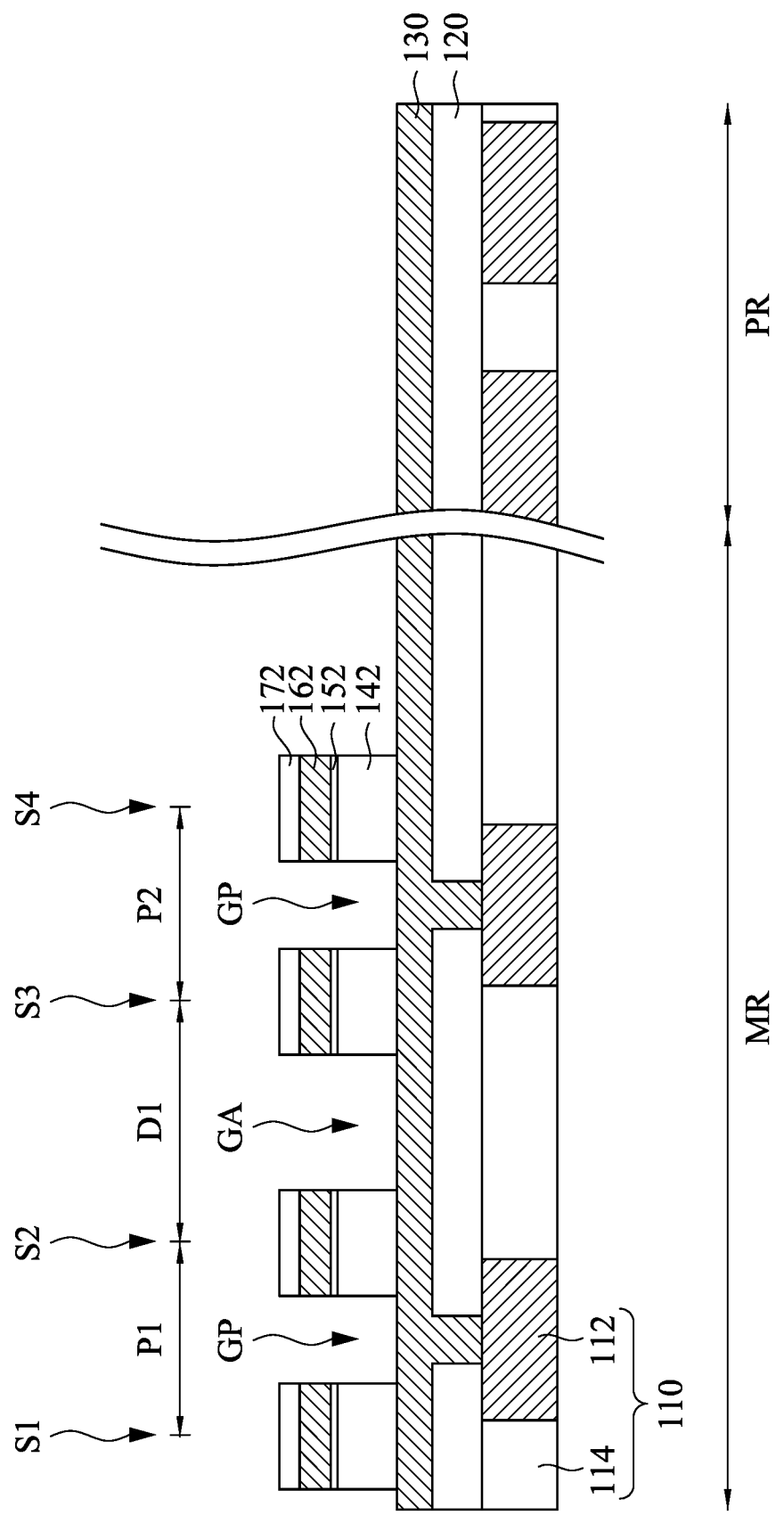

Reference is made to FIG. 4. Plural etching processes are performed to remove portions of the hard mask layer 170, underlying top electrode layer 160, the capping layer 150, and the underlying resistance switching layer 140 not protected by the patterned resist mask PM (referring to FIG. 3).

In some embodiments, the etching processes may be a first etching process and a second etching process performed after the first etching process. The first etching process is performed by using the patterned resist mask PM (referring to FIG. 3) as an etch mask. The first etching process is performed to pattern the hard mask layer 170, the top electrode layer 160, and the capping layer 150 (referring to FIG. 3) into hard masks 172, top electrodes 162, capping layers 152. The resistance switching layer 140 (referring to FIG. 3) may have a higher etch resistance to the first etching process than that of the hard mask layer 170, the top electrode layer 160, and the capping layer 150, such that the resistance switching layer 140 remains substantially intact after the first etching process. Then, the second etching process is performed by using the patterned resist mask PM and/or the hard masks 172 as etch mask. The second etching process is performed to pattern the resistance switching layer 140 (referring to FIG. 3) into resistive switching elements 142. The bottom electrode layer 130 may have a higher etch resistance to the second etching process than that of the resistance switching layer 140, such that the bottom electrode layer 130 remains substantially intact after the second etching process. In some embodiments, the etching processes (e.g., the first and second etching process) may be an anisotropic etching process. In some embodiments, the patterned resist mask PM is consumed by the etching process or removed using, for example, an ash process, after the etching process.

Through the etching processes, plural stacks S1-S4 are formed over the bottom electrode layer 130 over the memory region MR of the metal/dielectric layers 110. Each of the stack S1 includes a hard mask 172, a top electrode 162, a capping layer 152, and a resistive switching element 142.

In some embodiments, the stacks S1-S4 are sequentially arranged in pairs. For example, in some embodiments, the stacks S1 and S2 are paired and have a pitch P1 therebetween, in which the pitch P1 is greater than a distance D1 between the stacks S2 and S3. Similarly, the stacks S3 and S4 are paired and have a pitch P2 therebetween, in which the pitch P2 is greater than the distance D1. The pair configuration results in the gap GP between the paired stacks (e.g., the stacks S1 and S2, or the stacks S3 and S4) is greater than the gap GA between adjacent stacks of two pairs (e.g., the stacks S2 and S3).

Figure 5:
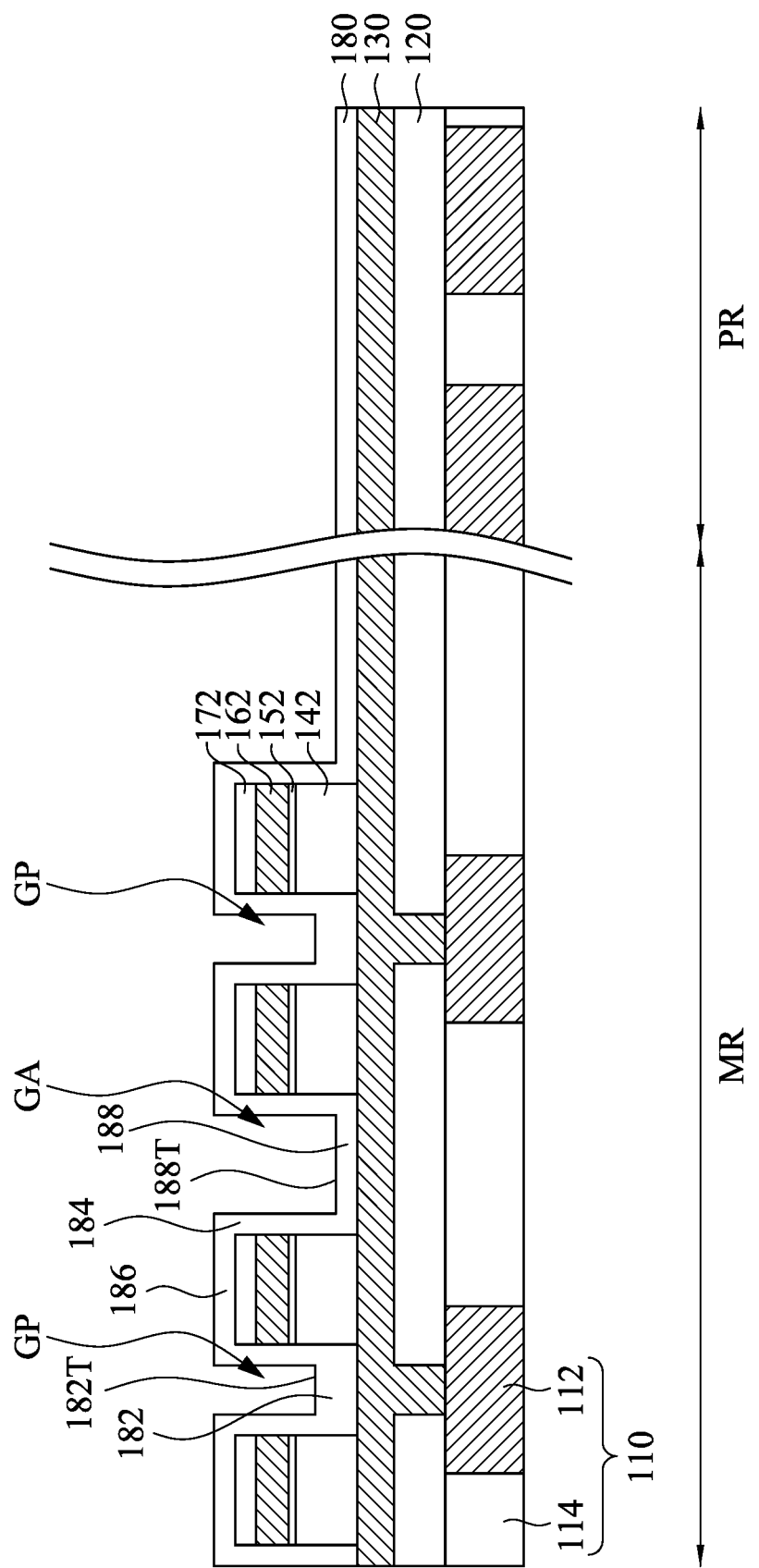

Reference is made to FIG. 5. A spacer layer 180 is conformally formed over the top surfaces and the sidewalls of the stacks S1-S4 and the top surface of the bottom electrode layer 130. The spacer layer 180 is deposited over the memory region MR as well as the peripheral region PR. In some embodiments, the spacer layer 180 may be made of silicon nitride, silicon carbide, or silicon carbon nitride. The spacer layer 180 may be formed using CVD, PVD, ALD, the like, and/or combinations thereof.

In some embodiments, the spacer layer 180 has portions 182-188. The portion 182 is in the gaps GP and on the top surface of the bottom electrode layer 130. The portion 184 is on the sidewalls of the stacks S1-S4. For example, herein, the portion 184 extends from the top surface of the bottom electrode layer 130 to a sidewall of the hard mask 172. The portion 186 is on the top surfaces of the stacks S1-S4. The portion 188 is in the gap GA and on the top surface of the bottom electrode layer 130. In the present embodiments where the stacks S1-S4 are arranged in pairs, the portions 182 of the spacer layer 180 tend to have a greater thickness in the gaps GP than the portion 188 of the spacer layer 180 in the gaps GA since the gaps GP are narrower than the gap GA (e.g., the pitches P1/P2 is shorter than the distance D1 as shown in FIG. 4). That is, a top surface 182T of the portions 182 of the spacer layer 180 is at a position higher than that of a top surface 188T of the portion 188 of the spacer layer 180. In some embodiments, the portions 182 of the spacer layer 180 have a greater thickness than the portion 186 of the spacer layer 180.

Figure 6:
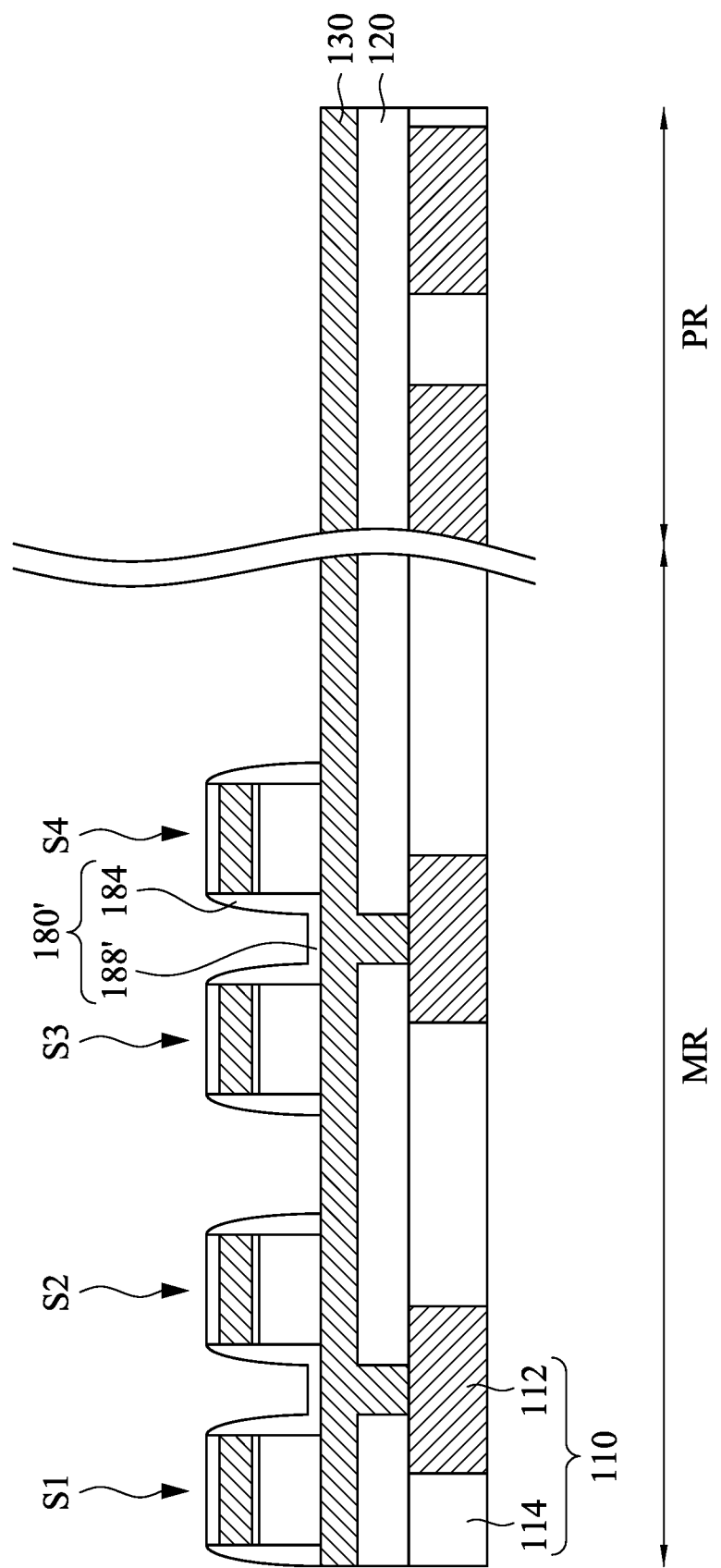

Reference is made to FIG. 6. One or more etching processes are performed to remove portions of the spacer layer 180, and the remaining portions of the spacer layer 180 are referred to as spacers 180'. The etching process may include an anisotropic etching process (e.g., plasma etching), which tends to thin or remove horizontal portions of the spacer layer 180, but leave vertical portions of the spacer layer not etched. For example, herein, the horizontal portions of the spacer layer 180 (e.g., the portions 182, 186, and 188 shown in FIG. 5) are thinned or removed by the etching process, while the vertical portions of the spacer layer 180 (e.g., the portion 188) remains.

In the present embodiments, since the portion 188 is thicker than the portions 182 and 186, the etching process may be tuned to remove the portions 182 and 186 and a part of the portion 188 (i.e., thin the portion 188), but leaves the other part of the portion 188 (referring to FIG. 5) on the bottom electrode layer 130, which is referred to as a portion 188' hereinafter. As such, after the etching process, the spacer layer 180 is patterned into spacers 180', in which each of the spacers 180' include portions 184 and a portion 188'. The spacers 180' expose portions of the bottom electrode layer 130. The spacers 180' surrounds and protects the sidewalls of the stacks S1-S4 and portions of the bottom electrode layer 130 during subsequent etch operations. In some embodiments, small portions of the hard masks 172 are consumed to ensure that the portions 182 and 186 is completely removed.

Figure 7:
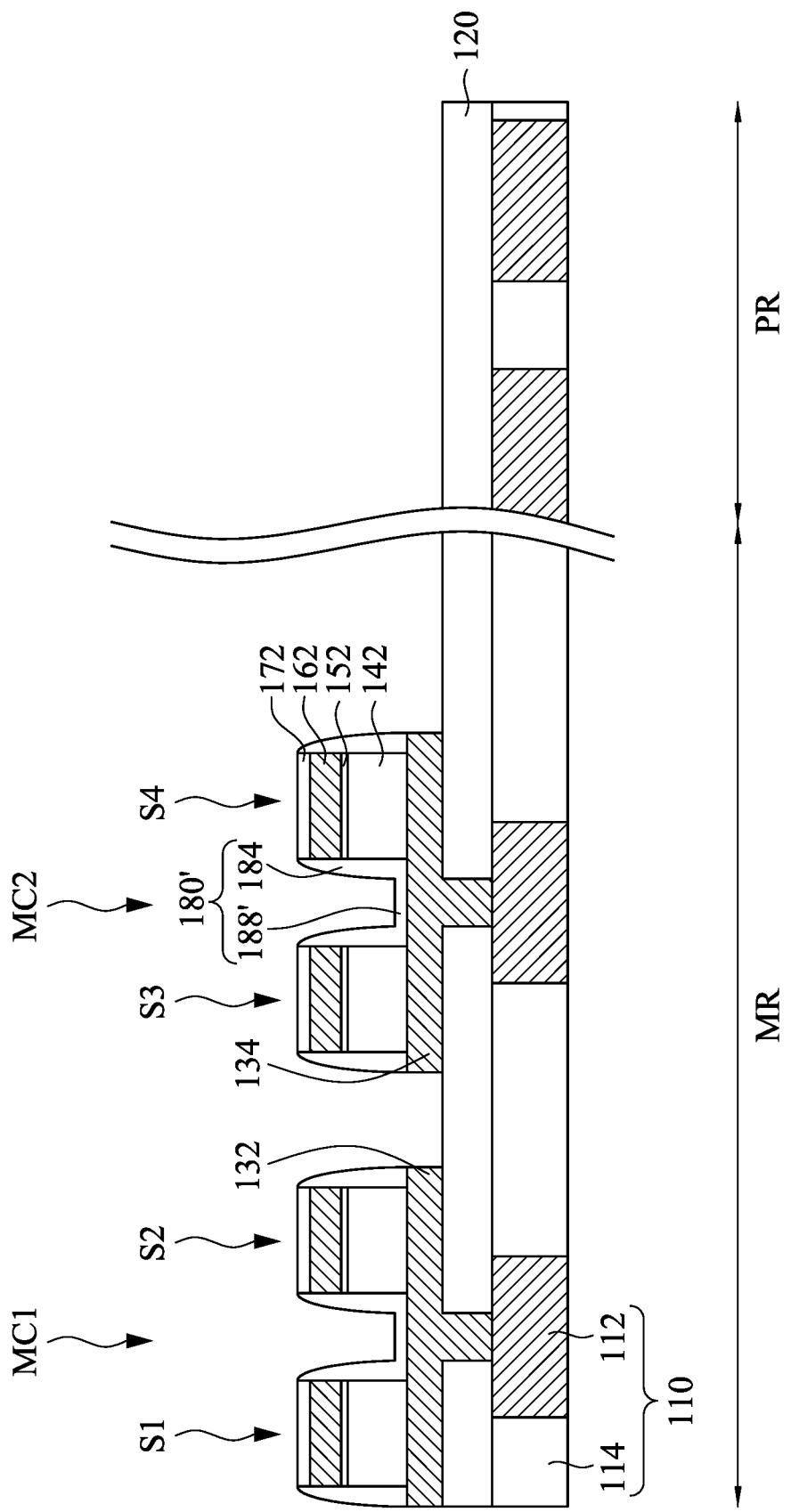

Reference is made to FIG. 7. The bottom electrode layer 130 is patterned into bottom electrodes 132 and 134 using one or more etching processes. The etching process are performed to remove the portions of the bottom electrode layer 130 exposed by the hard masks 172 and the spacers 180'. The hard masks 172 and the spacers 180' respectively have a higher etch resistance to the etching process than that of the bottom electrode layer 130, thereby protecting the stacks S1-S4 and portions of the bottom electrode layer 130 from being etched. After the etching process, the portions of the bottom electrode layer 130 covered by the spacers 180' and the hard masks 172 remains, while other portions of the bottom electrode layer 130 are removed. The remaining portions of the bottom electrode layer 130 may be referred to as bottom electrodes 132 and 134. The spacers 180' overly the bottom electrodes 132, respectively. Due to the presence of the portions 188' of the spacers 180', a portion of the bottom electrode layer 130 uncovered by the stacks S1-S4 remains between the stacks S1 and S2, and between the stacks S3 and S4. Through the configuration, the paired stacks S1 and S2 are over the same bottom electrode 132. Similarly, the paired stacks S3 and S4 are over the same bottom electrode 134. For example, the portions 188' of the spacers 180' overly a portion of the bottom electrode 132 between the stacks S1 and S2 and a portion of the bottom electrode 134 between the stacks S3 and S4, and the portions 188' of the spacers 180' may extend along a top surface of the portions of the bottom electrodes 132 and 134. The combination of the stacks S1 and S2 and the bottom electrode 132 may be referred to a memory cell MC1. Similarly, the combination of the stacks S3 and S4 and the bottom electrode 134 may be referred to a memory cell MC2.

In some embodiments, the memory stop layer 120 may has a higher etch resistance to the etching process than that of the bottom electrode layer 130, such that the etching process may stop when reaching the memory stop layer 120. The memory stop layer 120 remains substantially intact after the etching process, thereby protecting the underlying metal/dielectric layers 110 from being etched.

Figure 8:
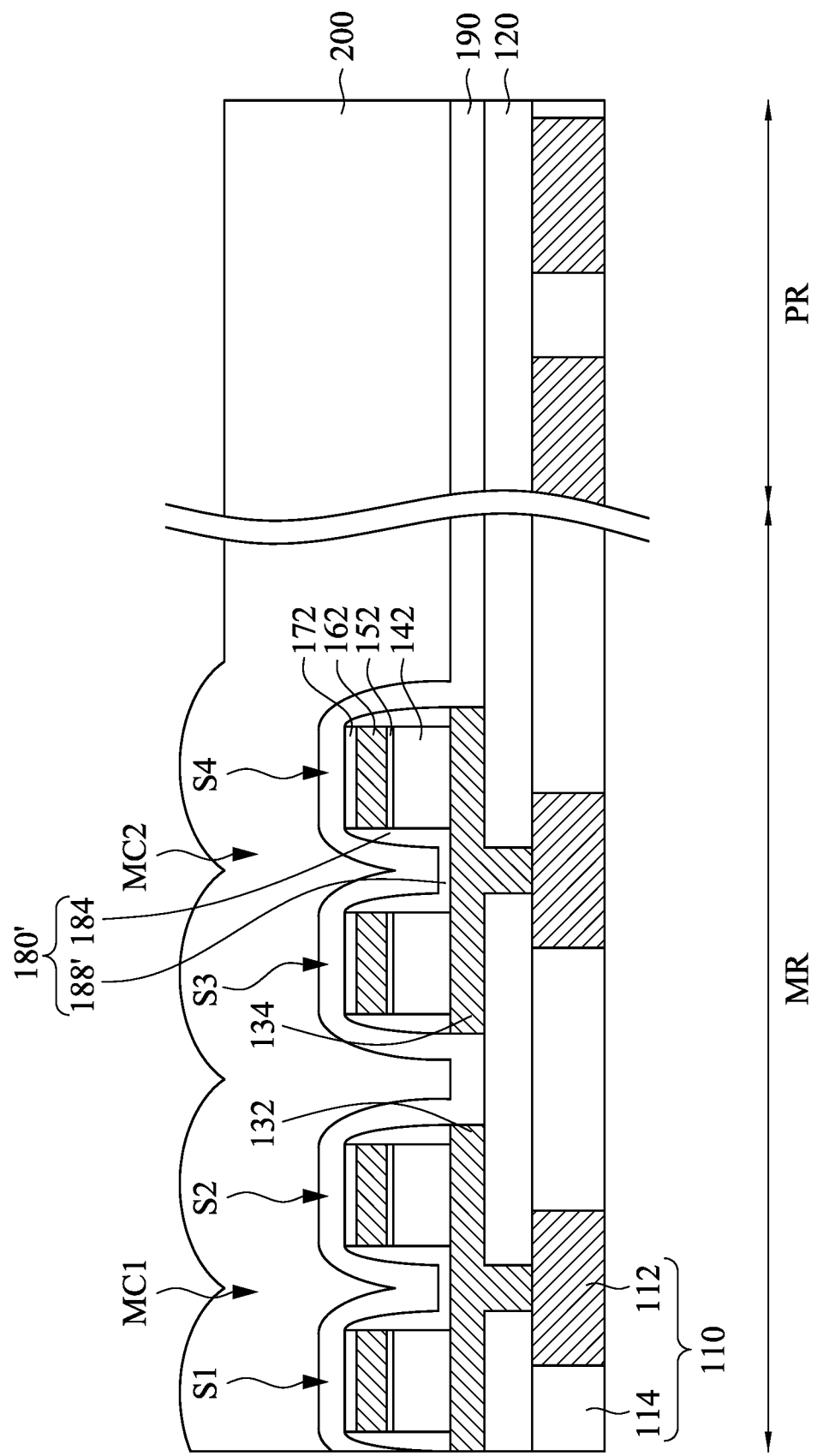

Reference is made to FIG. 8. A film layer 190 is conformally formed over memory region MR and the peripheral region PR. The film layer 190 covers the memory cells MC1 and MC2, the spacers 180', and the memory stop layer 120. The film layer 190 may be made of tetra-ethyl-ortho-silicate (TEOS) or other suitable dielectric materials, as examples. The film layer 190 may be deposited conformally over the second memory stop layer using a CVD, plasma enhanced CVD (PECVD), PVD, or other suitable technique.

An inter-layer dielectric layer 200 is deposited over the film layer 190 using suitable deposition techniques. The ILD layer 200 may be an extra low-k dielectric (ELK) layer, such as carbon doped silicon dioxide, may be an oxide, such as silicon oxide, and/or may be the like or a combination thereof. In some embodiments, the ILD layer 200 may be formed of a low-k dielectric material having a k value less than about 3.9. The k value of the ILD layer 200 may even be lower than about 2.8.

Figure 9A:
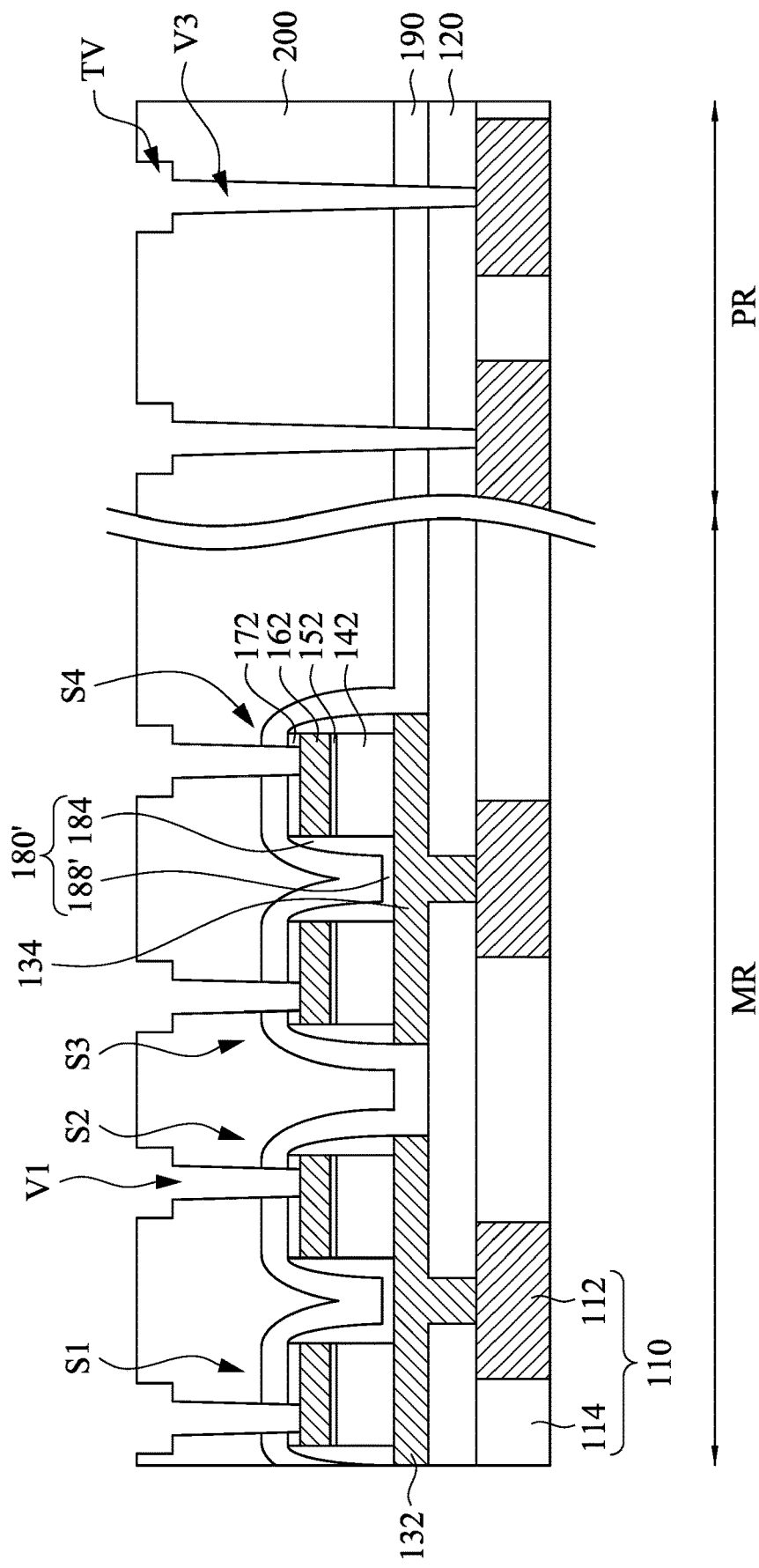
Figure 9B:
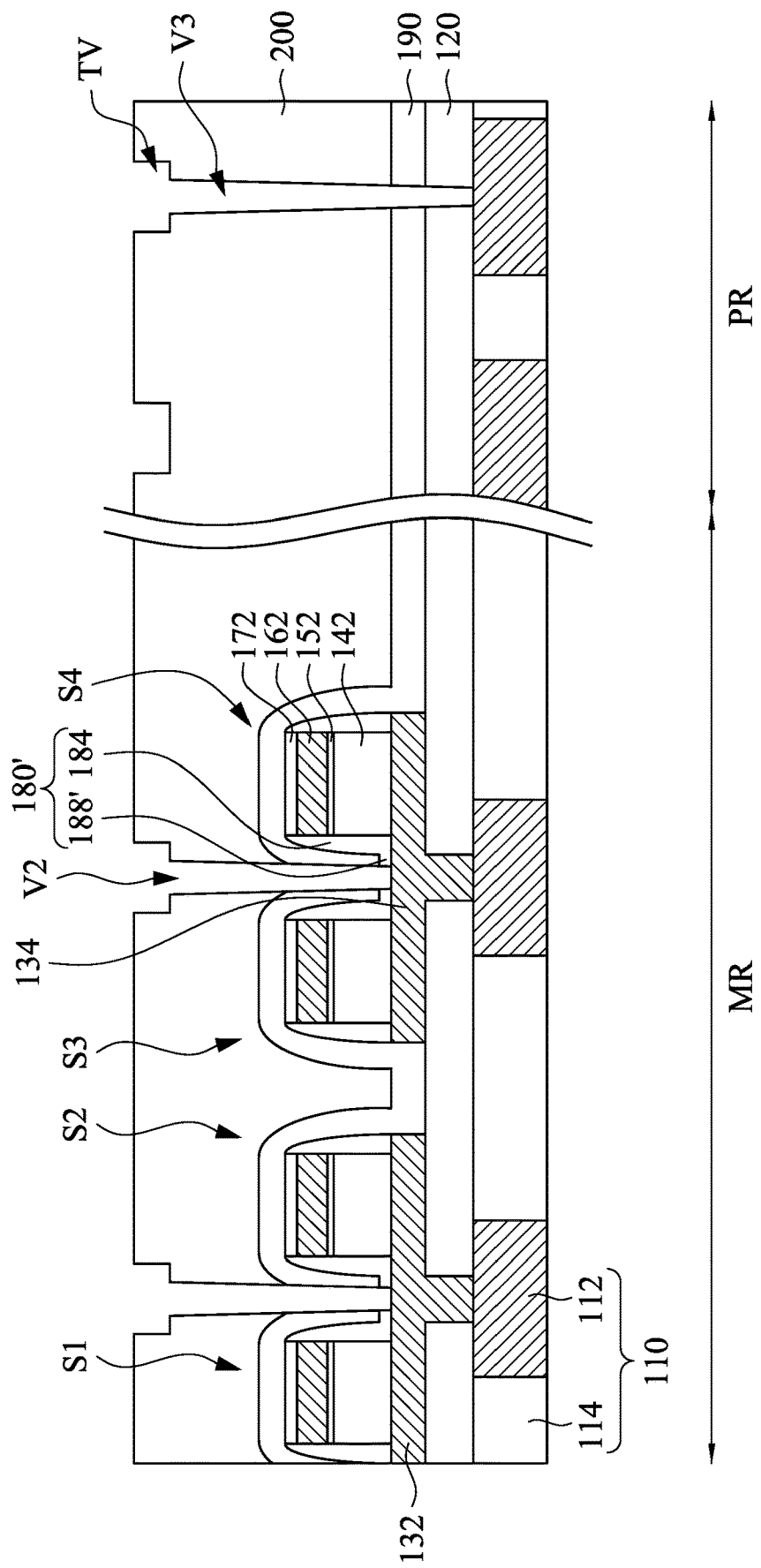

Reference is made to FIGS. 9A-9B. Top electrode vias V1, bottom electrode vias V2, contact vias V3, and trenches TV are formed in the ILD layer 200 by plural etching processes. The top electrode vias V1 is etched down through the hard masks 172 and the film layer 190 to the top electrodes 162. The bottom electrode vias V2 is etched down through the film layer 190 and the spacer 180' to the bottom electrodes 132 and 134. The contact vias V3 is etched down through the film layer 190 and the memory stop layer 120 to the conductive features 112. In some embodiments, the etching processes may include first and second etching processes. Through the first etching process, the ILD layer 200 is etched to form the top electrode vias V1, the bottom electrode vias V2, and the contact vias V3. The metal material (e.g., the top electrodes 162, the bottom electrodes 132 and 134, and the conductive features 112) may have a higher etch resistance to the first etching process than that of the ILD layer 200, the film layer 190, the spacer 180' and the memory stop layer 120, such that top electrodes 162, the bottom electrodes 132 and 134, and the conductive features 112 are exposed by the vias V1-V3 and remain substantially intact after the first etching process. Subsequently, through the second etching process, the ILD layer 200 is etched to form trenches TV over the vias V1-V3. In some embodiments, prior to the second etching process, the vias V1-V3 may be filled with some temporary filling material, such as photoresist, such that the second etching process may not further etch the vias V1-V3. A cleaning process may be performed to remove etchants after the first and second etching processes. In some embodiments, the cleaning process may also remove the temporary filling material from the vias V1-V3.

Figure 10A:
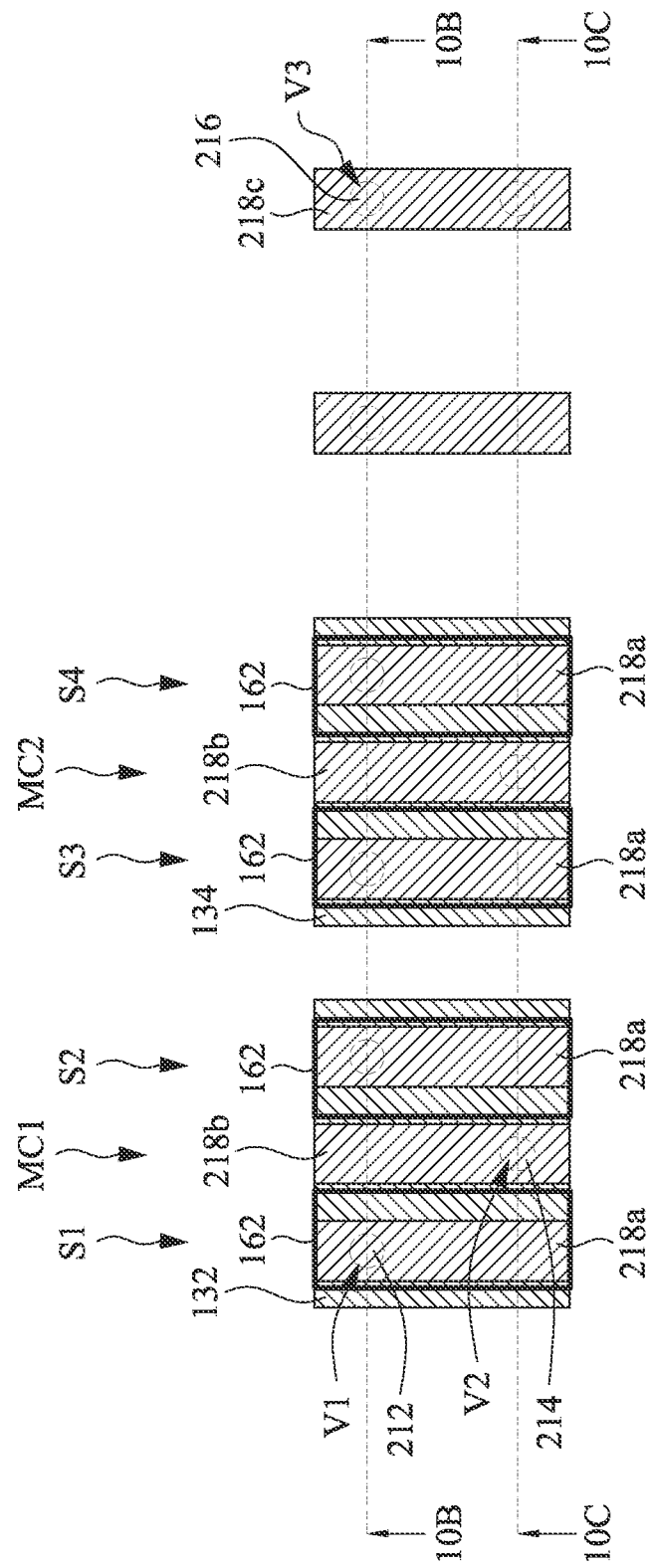
Figure 10B:
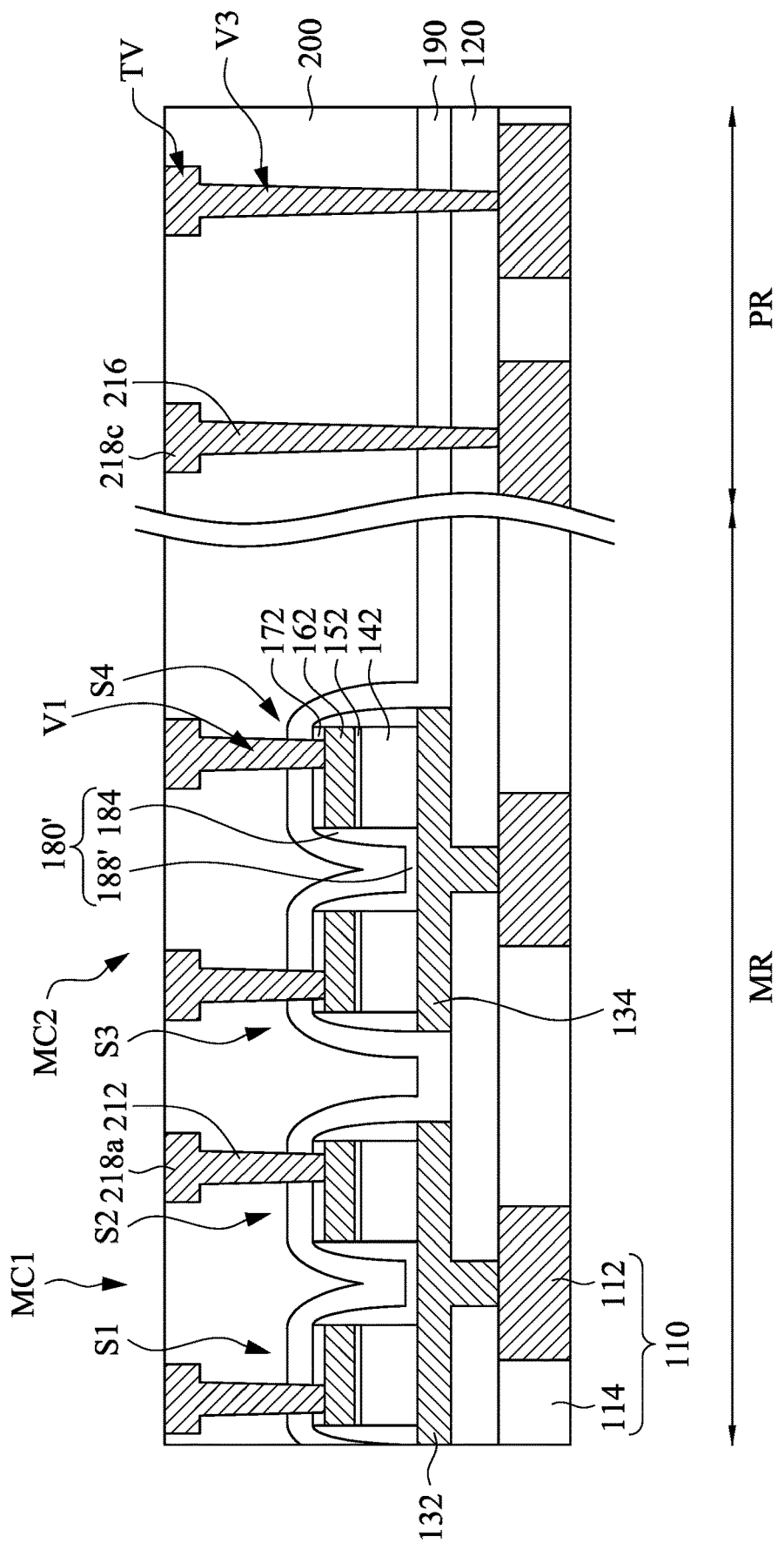
Figure 10C:
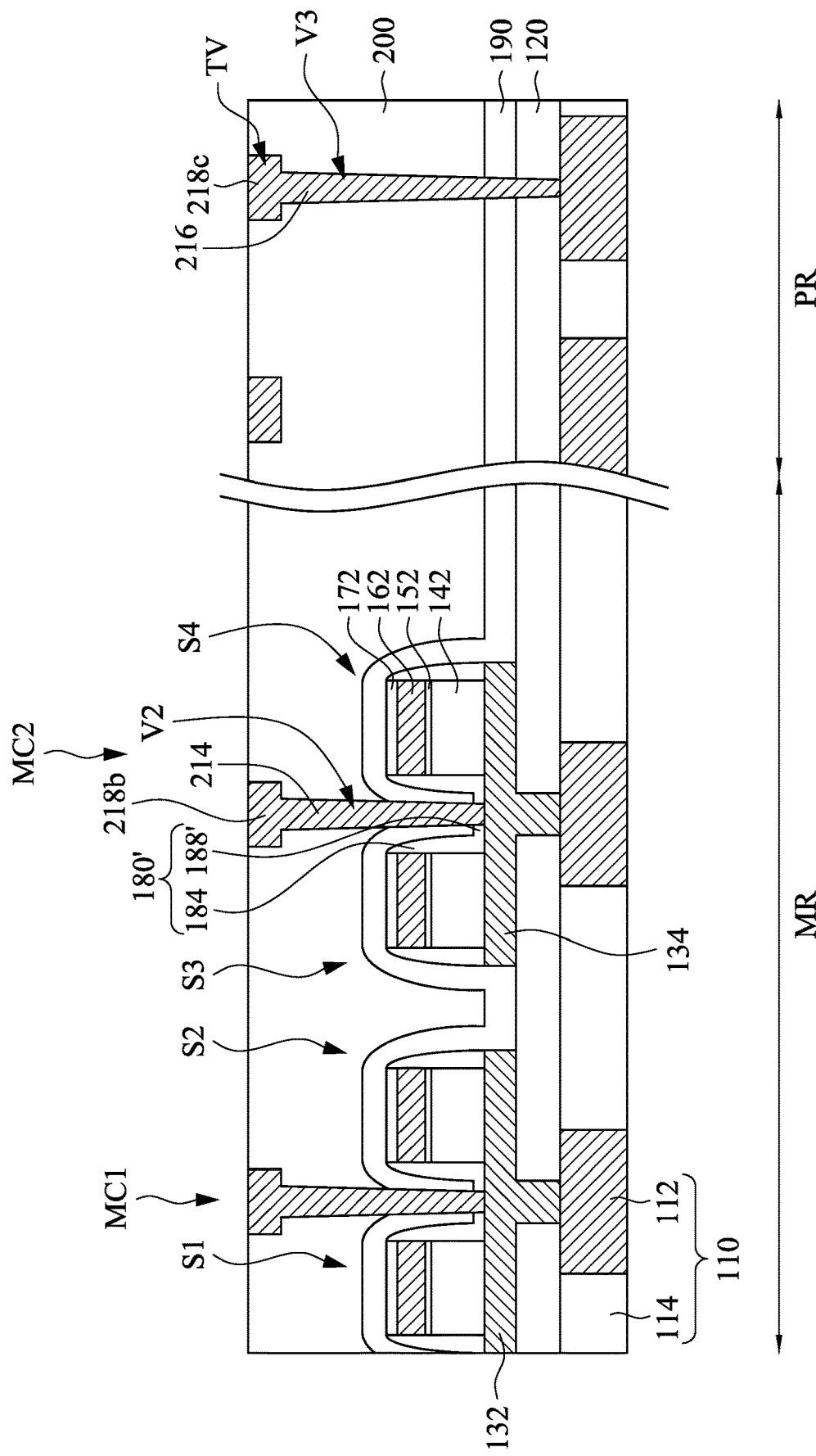

Reference is made to FIGS. 10A-10C. FIG. 10B is a cross-sectional view taken along line 10B-10B of FIG. 10A. FIG. 10C is a cross-sectional view taken along line 10C-10C of FIG. 10A. The top electrode vias V1, the bottom electrode vias V2, the contact vias V3, and the trenches TV are filled with a conductive material, such as a metal. A portion of the conductive material in the top electrode vias V1 may form top electrode contacts 212 connected to the top electrodes 162. The top electrode contacts 212 may be in the hard mask 162, the film layer 190, and the ILD layer 200. A portion of the conductive material in the bottom electrode vias V2 may form bottom electrode contacts 214 connected to the bottom electrodes 132-134, respectively. The bottom electrode contacts 214 may be in the film layer 190, the spacer 180', and the ILD layer 200. In some embodiments, the bottom electrode contacts 214 may be between the stacks S1 and S2 or the stacks S3 and S4. Another portion of the conductive material in the contact vias V3 may form contacts 216 connected to the conductive features 112. The contacts 216 may be in the film layer 190, the memory stop layer 120, and the ILD layer 200. Furthermore, a portion of the conductive material in the trench TV may form conductive lines 218a, 218b, and 218c connected to the contacts 212-216, respectively. For example, the conductive lines 218a connected to the top electrode contacts 212 may be referred to as bit lines, and the conductive lines 218b connected to the bottom electrode contacts 214 may be referred to as false lines. The filling may also include one or more liner and barrier layers in additional a metal conductor. The liner and/or barrier may be conductive and deposited using CVD or PVD. The metal may be deposited using PVD or one of the plating methods, such as electrochemical plating. After the filling, a planarization process, such as chemical mechanical polishing (CMP), is performed to remove excess conductive feature.

Through the steps, memory cells MC1 and MC2 are formed with suitable top electrode contacts 212 and bottom electrode contacts 214. The memory cells MC1 and MC2 may include the spacer 180' continuously surrounding the stacks S1 and S2 or the stacks S3 and S4. To be specific, the portions 184 of the spacer 180' surround the memory stack S1-S4, and the portion 188' of the spacer 180 extends along a top surface of the bottom electrode 132/134 and connecting two of the portions 184 of the spacer 180'. The spacer 180' may not cover a sidewall of the bottom electrodes 132 and 134. For example, herein, the film layer 190 is in contact with the sidewalls of the bottom electrodes 132 and 134. In some embodiments, an interface between the bottom electrode 132/134 and the film layer 190 is connected with an interface between the spacer 180' and the film layer 190.

Figure 11:
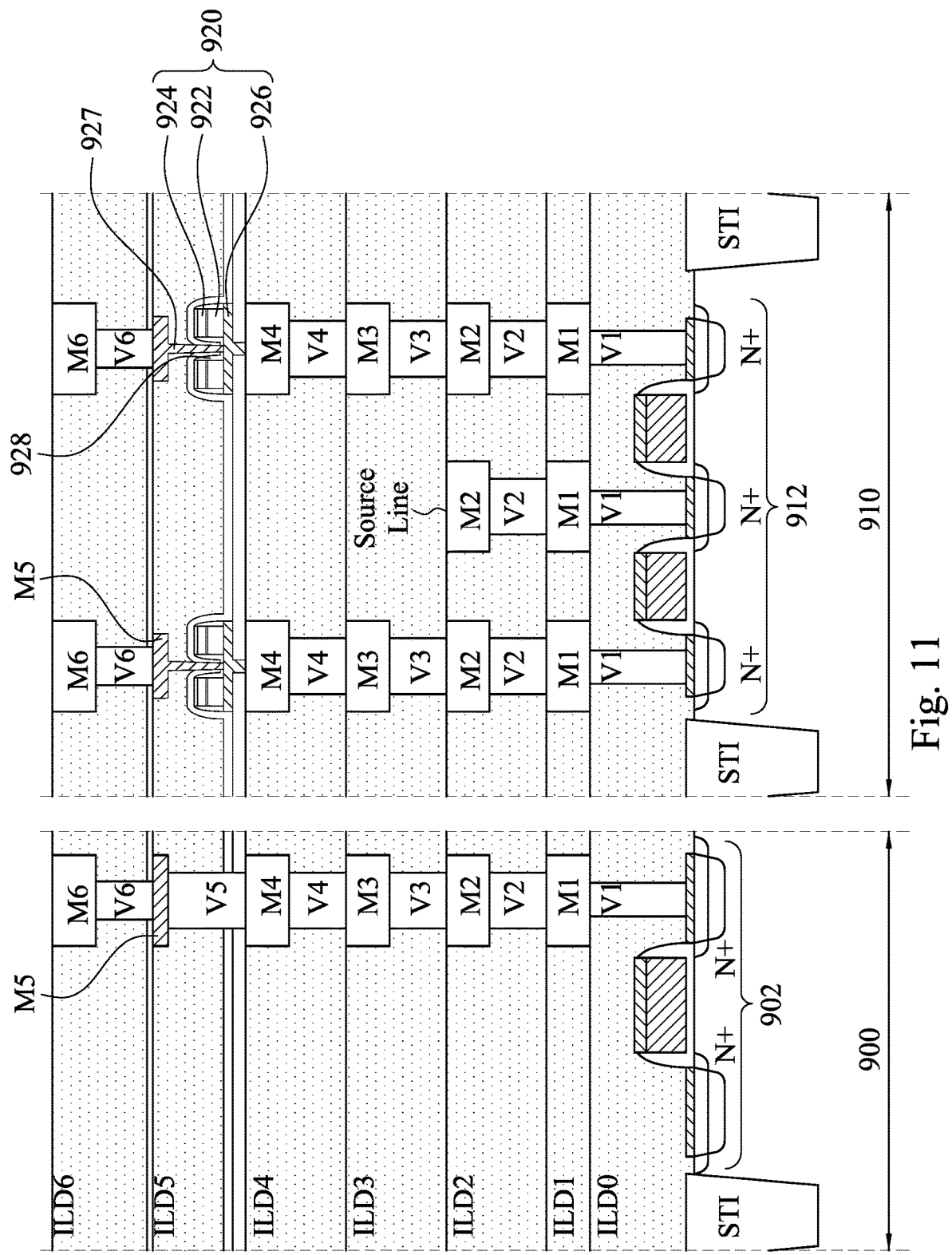
FIG. 11 is a schematic cross-sectional view of an integrated circuit in accordance with some embodiments of the present disclosure.

FIG. 11 is a cross-sectional view of a semiconductor device 400 in accordance with some embodiments of the present disclosure. The semiconductor device includes a logic region 900 and a memory region 910. Logic region 900 may include circuitry, such as an exemplary logic transistor 902, for processing information received from the memory cells 920 in the memory region 910 and for controlling reading and writing functions of the memory cells 920. In some embodiments, the memory cells 920 may be similar to those shown in FIGS. 10A-10C. For example, the memory cells 920 includes a resistive switching element 922, a top electrode 924 over the resistive switching element 922, and a bottom electrode 926 under the resistive switching element 922. The memory cells 920 further includes spacers 928 surrounding the top electrode 924 and the resistive switching element 922, the spacers 928 covers a top surface of the bottom electrode 926, but does not cover a sidewall of the bottom electrode 926. Top electrode contact (not shown) and bottom electrode contact 927 are connected to the top electrodes 924 and the bottom electrodes 926 through the spacers 928.

As depicted, the semiconductor device is fabricated using five metallization layers, labeled as M1 through M6, with five layers of metallization vias or interconnects, labeled as V1 through V6. Other embodiments may contain more or fewer metallization layers and a corresponding more or fewer number of vias. Logic region 900 includes a full metallization stack, including a portion of each of metallization layers M1-M6 connected by interconnects V2-V6, with V1 connecting the stack to a source/drain contact of logic transistor 902. The memory region 910 includes a full metallization stack connecting memory cells 920 to transistors 912 in the memory region 910, and a partial metallization stack connecting a source line to transistors 912 in the memory region 910. Memory cells 920 are depicted as being fabricated in between the top of the M4 layer and the bottom the M6 layer. Also included in semiconductor device is a plurality of ILD layers. Six ILD layers, identified as ILD0 through ILD6 are depicted in FIG. 11 as spanning the logic region 900 and the memory region 910. The ILD layers may provide electrical insulation as well as structural support for the various features of the semiconductor device during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the fabrication of the memory cells uses one mask, thereby saving fabrication costs. Another advantage is that topography difference at the boundary area is reduced since the bottom electrodes are patterned without using another mask. Still another advantage is that the fabrication of the memory cell is comparable to the process flow of logic devices.

According to some embodiments of the present disclosure, a memory device includes a first bottom electrode, a first memory stack, a second memory stack, and a first spacer. The first bottom electrode has a first portion and a second portion connected to the first portion. The first memory stack is over the first portion of the first bottom electrode. The first memory stack includes a first resistive switching element and a first top electrode over the first resistive switching element. The second memory stack is over the second portion of the first bottom electrode. The second memory stack comprises a second resistive switching element and a second top electrode over the second resistive switching element. The first spacer continuously surrounds the first memory stack and the second memory stack.

According to some embodiments of the present disclosure, a memory device includes a bottom electrode, a memory stack, and a spacer. The memory stack is over the bottom electrode. The memory stack includes a resistive switching element and a top electrode over the resistive switching element. The spacer has a first portion surrounding the memory stack and a second portion extending along a top surface of the bottom electrode.

According to some embodiments of the present disclosure, a memory device includes a first bottom electrode, a first memory stack, a second memory stack, and a first conductive feature. The first bottom electrode has a first portion, a second portion, and a third portion connecting the first portion of the first bottom electrode to the second portion of the first bottom electrode. The first memory stack is over the first portion of the first bottom electrode, wherein the first memory stack comprises a first resistive switching element and a first top electrode over the first resistive switching element. The second memory stack is over the second portion of the first bottom electrode, wherein the second memory stack comprises a second resistive switching element and a second top electrode over the second resistive switching element. The first conductive feature is between the first memory stack and the second memory stack and extending from the third portion of the first bottom electrode to a position higher a top surface of the first memory stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first bottom electrode having a first portion and a second portion connected to the first portion;
   a first memory stack over the first portion of the first bottom electrode, wherein the first memory stack comprises a first resistive switching element and a first top electrode over the first resistive switching element;
   a second memory stack over the second portion of the first bottom electrode, wherein the second memory stack comprises a second resistive switching element and a second top electrode over the second resistive switching element;
   a first spacer continuously surrounding the first memory stack and the second memory stack in a first portion of the memory device;
   a metal via extending through the first spacer to a top surface of the first bottom electrode in a second portion of the memory device; and
   an oxide dielectric layer covering the first memory stack, the second memory stack, and the first bottom electrode, wherein the oxide dielectric layer is in contact with a sidewall of the first bottom electrode, and is interrupted between the first memory stack and the second memory stack.

2. The memory device of claim 1, further comprising:
   a transistor electrically connected to the first bottom electrode.

3. The memory device of claim 1, wherein the first spacer overlies the first bottom electrode.

4. The memory device of claim 1, wherein the metal via is between the first memory stack and the second memory stack.

5. The memory device of claim 1, further comprising:
   a second bottom electrode having a third portion and a fourth portion connected to the third portion;
   a third memory stack over the third portion of the second bottom electrode; and
   a fourth memory stack over the fourth portion of the second bottom electrode, wherein the third memory stack is adjacent to and between the fourth memory stack and the second memory stack, and a distance between the second memory stack and the third memory stack is greater than a distance between the first memory stack and the second memory stack.

6. The memory device of claim 5, further comprising:
   a second spacer that is separated from the first spacer and surrounds the third memory stack and the fourth memory stack.

7. The memory device of claim 1, wherein an interface formed by the metal via and the first spacer has a top position lower than a top position of the first spacer.

8. The memory device of claim 1, wherein a lower portion of a sidewall of the metal via is in contact with the first spacer, and an upper portion of the sidewall of the metal via is in contact with the oxide dielectric layer.

9. The memory device of claim 1, wherein the first spacer spaces the second resistive switching element apart from the first resistive switching element.

10. A memory device, comprising:
    a bottom electrode;
    a first memory stack and a second memory stack over the bottom electrode, wherein each of the first memory stack and the second memory stack comprises a resistive switching element and a top electrode over the resistive switching element;

a spacer having a first portion surrounding the first memory stack and a second portion extending along a top surface of the bottom electrode, wherein a top surface of the second portion of the spacer has a lowest position lower than a top surface of the first portion of the spacer, lower than a top surface of the top electrode, and directly over the top surface of the bottom electrode;

a metal via in direct contact with the top surface of the bottom electrode and between the first memory stack and the second memory stack, wherein the metal via has a first portion in the second portion of the spacer and a second portion over the first portion of the metal via; and an oxide dielectric layer covering the first memory stack, the second memory stack, and the bottom electrode, wherein the oxide dielectric layer is in contact with a sidewall of the bottom electrode, and is interrupted between the first memory stack and the second memory stack.

11. The memory device of claim 10, wherein a bottom surface of the spacer is on the top surface of the bottom electrode.

12. The memory device of claim 10, further comprising:
a hard mask over the first memory stack, wherein the first portion of the spacer extends from the top surface of the bottom electrode to a sidewall of the hard mask.

13. The memory device of claim 12, further comprising:
a conductive feature connected to the top electrode of the first memory stack, wherein the conductive feature is at least partially in the hard mask.

14. The memory device of claim 10,
wherein the oxide dielectric layer further covers the spacer, and an interface between the bottom electrode and the oxide dielectric layer is connected with an interface between the spacer and the oxide dielectric layer.

15. The memory device of claim 10, wherein the resistive switching element comprises a metal oxide.

16. A memory device, comprising:
a first bottom electrode having a first portion, a second portion, and a third portion connecting the first portion of the first bottom electrode to the second portion of the first bottom electrode, wherein the third portion of the first bottom electrode has a top surface in direct contact with top surfaces of the first and second portions of the first bottom electrode;

a first memory stack over the first portion of the first bottom electrode, wherein the first memory stack comprises a first resistive switching element and a first top electrode over the first resistive switching element;

a second memory stack over the second portion of the first bottom electrode, wherein the second memory stack comprises a second resistive switching element and a second top electrode over the second resistive switching element; and a first conductive feature between the first memory stack and the second memory stack and extending from the third portion of the first bottom electrode to a position higher than a top surface of the first memory stack, wherein the first conductive feature is in direct contact with the top surface of the third portion of the first bottom electrode.

17. The memory device of claim 16, further comprising:
a spacer having a first portion surrounding the first memory stack, a second portion surrounding the second memory stack, and a third portion connecting the first portion of the spacer to the second portion of the spacer, wherein the third portion of the spacer surrounds the first conductive feature.

18. The memory device of claim 17, wherein a top surface of the third portion of the spacer is lower than the top surface of the first memory stack.

19. The memory device of claim 16, further comprising:
a second conductive feature over the first top electrode of the first memory stack; and
a first conductive line on the first conductive feature; and
a second conductive line on the second conductive feature, wherein the first and second conductive lines are level and parallel with each other.

20. The memory device of claim 16, further comprises:
a second bottom electrode level with the first bottom electrode;
a third memory stack over the second bottom electrode; and
a second conductive feature extending from the second bottom electrode to a position higher a top surface of the third memory stack.

* * * * *